(12) United States Patent
Wang et al.

(10) Patent No.: US 12,029,044 B2
(45) Date of Patent: Jul. 2, 2024

(54) SEMICONDUCTOR STRUCTURE AND METHOD FOR FORMING THE SAME

(71) Applicant: UNITED MICROELECTRONICS CORP., Hsin-Chu (TW)

(72) Inventors: Hui-Lin Wang, Taipei (TW); Yu-Ping Wang, Hsinchu (TW); Chen-Yi Weng, New Taipei (TW); Chin-Yang Hsieh, Tainan (TW); Yi-Hui Lee, Taipei (TW); Ying-Cheng Liu, Tainan (TW); Yi-An Shih, Changhua County (TW); I-Ming Tseng, Kaohsiung (TW); Jing-Yin Jhang, Tainan (TW); Chien-Ting Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/127,651

(22) Filed: Mar. 28, 2023

(65) Prior Publication Data
US 2023/0238043 A1 Jul. 27, 2023

Related U.S. Application Data

(60) Continuation of application No. 17/460,348, filed on Aug. 30, 2021, now Pat. No. 11,646,069, which is a (Continued)

(30) Foreign Application Priority Data
Jul. 29, 2019 (CN) .......................... 201910688355.7

(51) Int. Cl.
*H10B 61/00* (2023.01)
*G11C 11/16* (2006.01)
(Continued)

(52) U.S. Cl.
CPC ............ *H10B 61/00* (2023.02); *G11C 11/161* (2013.01); *H10B 61/10* (2023.02); *H10N 50/01* (2023.02); *H10N 50/80* (2023.02)

(58) Field of Classification Search
CPC ........ H10B 51/40; H10B 51/50; H10B 53/40; H10B 53/50; H10B 61/00; H10B 61/10; H10N 35/01; H10N 35/10
See application file for complete search history.

(56) References Cited

U.S. PATENT DOCUMENTS 8,278,122 B2 10/2012 Lu
9,159,910 B2 10/2015 Kang
(Continued)

FOREIGN PATENT DOCUMENTS

CN 102142399 A 8/2011
CN 107068757 A 8/2017

*Primary Examiner* — Robert G Bachner
*Assistant Examiner* — Molly K Reida
(74) *Attorney, Agent, or Firm* — Winston Hsu (57) ABSTRACT

A semiconductor structure includes a substrate having a memory device region and a logic device region, a first dielectric layer on the substrate, a plurality of memory stack structures on the first dielectric layer on the memory device region, an insulating layer conformally covering the memory stack structures and the first dielectric layer, a second dielectric layer on the insulating layer and completely filling the spaces between the memory stack structures, and a first interconnecting structure formed in the second dielectric layer on the logic device region. A top surface of the first interconnecting structure is flush with a top surface of the second dielectric layer and higher than top surfaces of the memory stack structures.

11 Claims, 12 Drawing Sheets

Related U.S. Application Data division of application No. 16/556,170, filed on Aug. 29, 2019, now Pat. No. 11,139,011.

(51) Int. Cl.
    *H10N 50/01*     (2023.01)
    *H10N 50/80*     (2023.01)

(56) References Cited

U.S. PATENT DOCUMENTS

| | | |
|---|---|---|
| 9,190,260 B1 | 11/2015 | Zhang |
| 9,502,466 B1 | 11/2016 | Chuang |
| 9,818,935 B2 | 11/2017 | Chuang |
| 9,887,130 B2 | 2/2018 | Hsieh |
| 10,032,828 B2 | 7/2018 | Chuang |
| 11,238,912 B1 | 2/2022 | Wu |
| 11,631,803 B2 | 4/2023 | Wang |
| 11,631,805 B2 | 4/2023 | Kuo |
| 11,706,995 B2 | 7/2023 | Kuo |
| 11,737,285 B2 | 8/2023 | Hsu |
| 2011/0076784 A1 | 3/2011 | Druist |
| 2013/0267042 A1 | 10/2013 | Satoh |
| 2015/0255507 A1 | 9/2015 | Pakala |
| 2017/0054070 A1 | 2/2017 | Bak |
| 2017/0345869 A1 | 11/2017 | Park |
| 2018/0006085 A1 | 1/2018 | Chuang |
| 2018/0301505 A1* | 10/2018 | Chuang .................. H10N 50/10 |
| 2018/0351099 A1 | 12/2018 | Yang |
| 2019/0164584 A1* | 5/2019 | Chuang .................. H10N 50/85 |
| 2019/0165041 A1 | 5/2019 | Chuang |
| 2019/0165256 A1 | 5/2019 | Tien |
| 2019/0165258 A1 | 5/2019 | Peng |
| 2020/0144484 A1* | 5/2020 | Chen ....................... H10B 61/22 |
| 2021/0020828 A1 | 1/2021 | Wang |

\* cited by examiner

SEMICONDUCTOR STRUCTURE AND METHOD FOR FORMING THE SAME

CROSS REFERENCE TO RELATED APPLICATIONS

This application is a continuation application of U.S. application Ser. No. 17/460,348, filed on Aug. 30, 2021, which is a division of U.S. application Ser. No. 16/556,170, filed on Aug. 29, 2019. The contents of these applications are incorporated herein by reference.

BACKGROUND OF THE INVENTION

1. Field of the Invention

The present invention generally relates to a semiconductor structure and method for forming the same. More particularly, the present invention relates to a magnetoresistive random access memory (MRAM) and method for forming the same.

2. Description of the Prior Art

A magnetoresistive random access memory (MRAM) is a kind of non-volatile memory that has drawn a lot of attention in this technology field recently regarding its potentials of incorporating advantages of other kinds of memories. For example, an MRAM device may have an operation speed comparable to SRAMs, the non-volatile feature and low power consumption comparable to flash, the high integrity and durability comparable to DRAM. More important, the process for forming an MRAM device may be conveniently incorporated into existing semiconductor manufacturing processes.

A typical MRAM cell structure usually comprises a memory stack structure comprising magnetic tunnel junction (MTJ) disposed between the lower and upper interconnecting structures. Unlike conventional memories that store data by electric charge or current flow, an MRAM cell stores data by applying external magnetic fields to control the magnetic polarity and tunneling magnetoresistance (TMR) of the MTJ.

However, the manufacturing of MRAM devices is still confronted with challenges. The memory stack structure is usually covered by an insulating layer for protection and passivation. Improper thickness of the insulating layer on the top surface of the memory stack structure may cause difficulty for forming the top vias of the upper interconnecting structure. For example, when the insulating layer on the top surface of the memory stack structure is too thick, it may cause etching stop and insufficient contacting area between the top via and the top electrode of the memory stack structure. On the other hand, when the insulating layer on the top surface of the memory stack structure is too thin, it may be insufficient to protect the top electrode from being damaged by the etching process. Both of the situations may obstruct the MRAM to function properly.

SUMMARY OF THE INVENTION

In light of the above, the present invention is directed to provide a semiconductor structure and method for forming the same by which the thickness of the insulating layer on the top surface of the memory stack structure may be better controlled and the aforesaid problems caused by improper thickness of the insulating layer may be reduced.

One objective of the present invention is to provide a method for forming a semiconductor structure, including the steps of providing a substrate having a memory device region and a logic device region, forming a first dielectric layer on the substrate, forming a plurality of memory stack structures on the first dielectric layer on the memory device region, forming an insulating layer conformally covering top surfaces and sidewalls of the memory stack structures and the first dielectric layer, performing an etching back process to remove a portion of the insulating layer without exposing the memory stack structures, and forming a second dielectric layer on the insulating layer and completely filling the spaces between the memory stack structures.

Another objective of the present invention is to provide a semiconductor structure, which includes a substrate having a memory device region and a logic device region, a first dielectric layer on the substrate, a plurality of memory stack structures on the first dielectric layer on the memory device region, an insulating layer conformally covering the memory stack structures and the first dielectric layer, a second dielectric layer on the insulating layer and completely filling the spaces between the memory stack structures, and a first interconnecting structure formed in the second dielectric layer on the logic device region, wherein a top surface of the first interconnecting structure is flush with a top surface of the second dielectric layer and higher than top surfaces of the memory stack structures.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. The accompanying drawings are included to provide a further understanding of the embodiments, and are incorporated in and constitute a part of this specification. These embodiments are described in sufficient detail to enable those skilled in the art to practice the invention. Other embodiments may be utilized and that structural, logical and electrical changes may be made without departing from the spirit and scope of the present invention.

Figure 1:
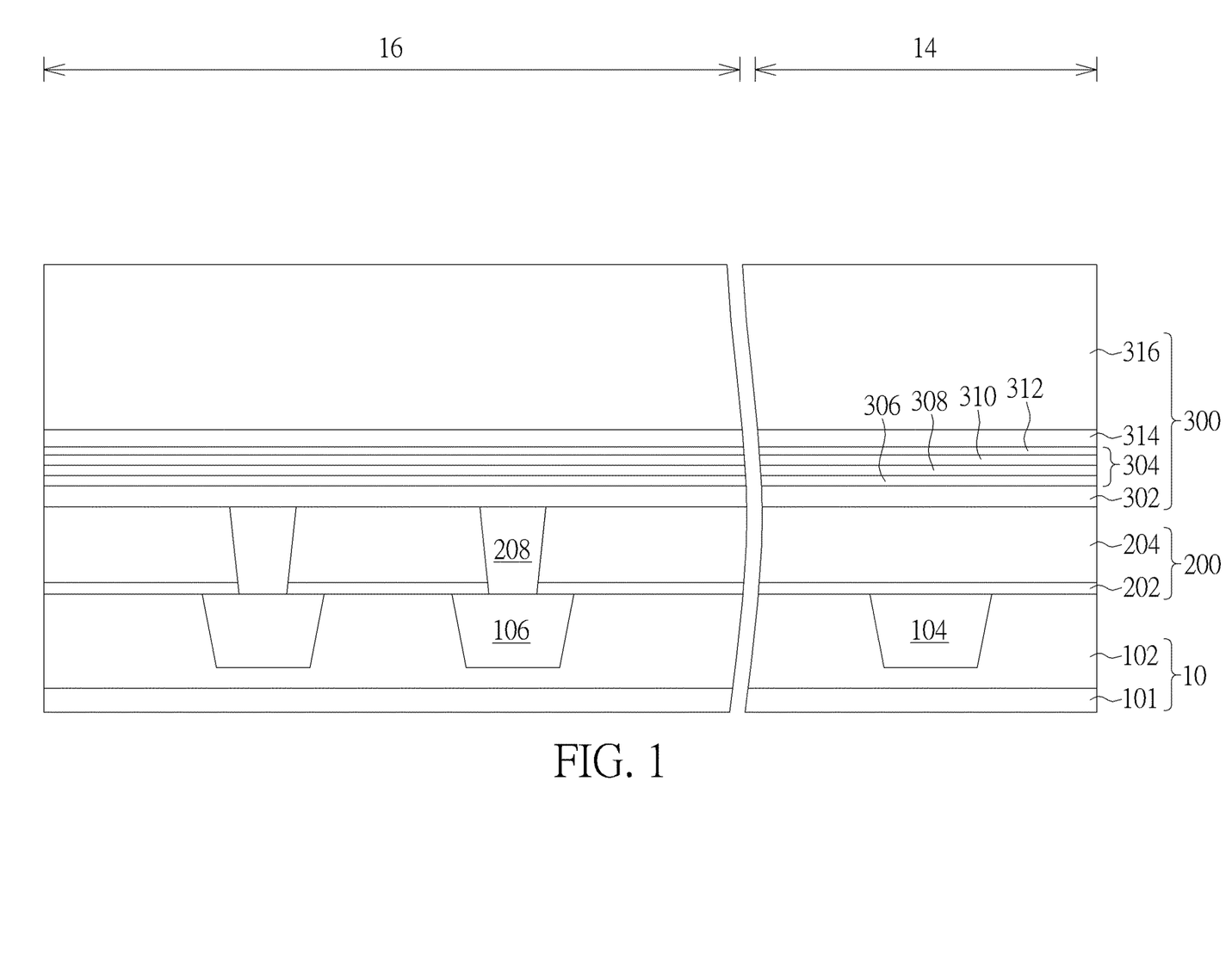
FIG. 1 to FIG. 7 are schematic diagrams illustrating the steps of forming a semiconductor structure according to a first embodiment of the present invention.

Please refer to FIG. 1 to FIG. 7, which are schematic diagrams illustrating the steps of forming a semiconductor structure according to a first embodiment of the present invention. As shown in FIG. 1, a substrate 10 having a logic device region 14 and a memory device region 16 is provided. The substrate 10 may include multiple layers, such as a semiconductor substrate 101 and an interlayer dielectric layer 102 on the semiconductor substrate 101. The semiconductor substrate 101 may be a silicon substrate, a silicon-on-insulator (SOI) substrate, or a Group III-V semiconductor substrate, but not limited thereto. The substrate 10 may comprise semiconductor structures formed therein. For example, active devices such as metal-oxide semiconductor (MOS) transistors, passive devices, conductive layers and dielectric layers such as interlayer dielectric layers, which are not shown in the diagrams for the sake of simplification, may be formed in the substrate 10. The interlayer dielectric layer 102 may comprise dielectric materials such as silicon oxide ($SiO_2$) or low-k dielectric materials such as fluorinated silica glass (FSG), silicon oxycarbide (SiCOH), spin on glass, porous low-k dielectric material, organic dielectric polymers, or a combination thereof, but not limited thereto. A plurality of interconnecting structures 104 and 106 may be formed in the interlayer dielectric layer 102 on the logic device region 14 and on the memory device region 16. For the sake of simplification, only one interconnecting structure 104 is shown in the logic device region 14 and only two interconnecting structures 106 are shown in the memory device region 16. The interconnecting structure 104 and the interconnecting structures 106 may comprise metal such as tungsten (W), copper (Cu), aluminum (Al), or other suitable metals, but not limited thereto. According to an embodiment, the interconnecting structures 104 and 106 comprise copper. The logic device region 14 and the memory device region 16 may occupy different areas of the substrate 10. According to an embodiment, the area of the memory device region 16 is smaller than the area of the logic device region 14. In some cases, the area of the memory device region 16 may be several times smaller than the area of the logic device region 14.

Please still refer to FIG. 1. A first dielectric layer 200 is formed on the interlayer dielectric layer 102 and completely covers the logic device region 14 and the memory device region 16. According to an embodiment, the first dielectric layer 200 may comprise multiple layers, such as an etching stop layer 202 and a first dielectric material layer 204 on the etching stop layer 202. The etching stop layer 202 and the first dielectric material layer 204 may include dielectric materials. For example, the etching stop layer 202 may comprise silicon nitride (SiN), silicon carbon nitride (SiCN) or silicon oxynitride (SiON), or a combination thereof, but not limited thereto. The first dielectric material layer 204 may comprise silicon oxide ($SiO_2$) or low-k dielectric materials, but not limited thereto. A plurality of vias 208 (bottom vias) are formed in the first dielectric layer 200 on the memory device region 16. The vias 208 penetrate through the first dielectric material layer 204 and the etching stop layer 202 and are in direct contact with and electrically coupled to the interconnecting structures 106. According to an embodiment, the vias 208 may comprise metal such as tungsten (W), copper (Cu), aluminum (Al), or other suitable metals, but not limited thereto. According to an embodiment, the vias 208 comprise copper.

Please still refer to FIG. 1. A memory stack layer 300 is formed on the first dielectric layer 200 and completely covers the logic device region 14 and the memory device region 16. According to an embodiment, the memory stack layer 300 may comprise multiple layers including, from bottom to top, a bottom electrode layer 302, a magnetic tunneling junction (MTJ) stack layer 304, a capping layer 314 and a top electrode layer 316. The bottom electrode layer 302 and the top electrode layer 316 may comprise conductive material such as titanium (Ti), tantalum (Ta), titanium nitride (TiN), tantalum nitride (TaN), or a combination thereof, but not limited thereto. The bottom electrode layer 302 and the top electrode layer 316 may comprise the same or different conductive materials. The capping layer 314 may comprise metal or metal oxide, such as aluminum (Al), magnesium (Mg), tantalum (Ta), ruthenium (Ru), tungsten dioxide ($WO_2$), nickel oxide (NiO), magnesium oxide (MgO), aluminum oxide ($Al_2O_3$), tantalum oxide ($Ta_2O_5$), molybdenum dioxide ($MoO_2$), titanium oxide ($TiO_2$), gadolinium oxide (GdO), or manganese oxide (MnO), or a combination thereof, but not limited thereto. The MTJ stack layer 304 may comprise multiple layers including, from bottom to top, a pinning layer 306, a pinned layer 308, a tunneling layer 310 and a free layer 312. The pinning layer 306 may comprise anti-ferromagnetic (AFM) material such as PtMn, IrMn, PtIr or the like, but not limited thereto. The pinning layer 306 is used to pin or fix nearby ferromagnetic layers to a particular magnetic polarity. The pinned layer 308 and the free layer 312 respectively comprise the same or different ferromagnetic material such as Fe, Co, Ni, FeNi, FeCo, CoNi, FeB, FePt, FePd, CoFeB, or the like. The magnetic polarity of the pinned layer 308 is pinned (anti-ferromagnetic coupled) by the pinning layer 306, while the magnetic polarity of the free layer 312 may be changed by an external magnetic field. The tunneling layer 310 is sandwiched between the pinned layer 308 and the free layer 312 and may comprise insulating material such as MgO, $Al_2O_3$, NiO, GdO, $Ta_2O_5$, $MoO_2$, $TiO_2$, tungsten oxide ($WO_2$), or a combination thereof, but not limited thereto. The pinning layer 306, the pinned layer 308, the tunneling layer 310 and the free layer 312 may respectively comprise single or multiple layers having a thickness ranges from several angstroms to dozens of nanometers.

Figure 2:
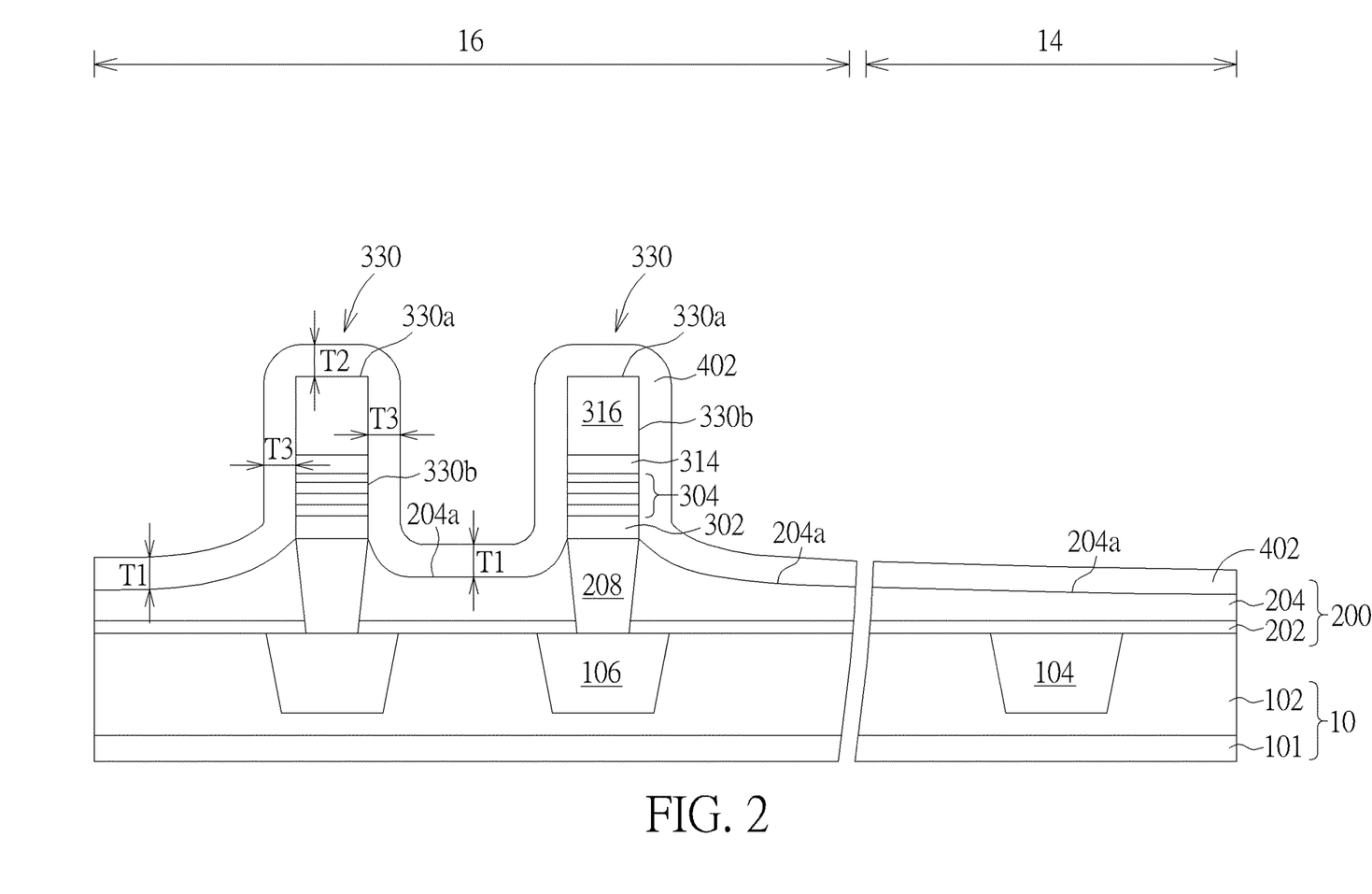

Please refer to FIG. 2. Subsequently, a patterning process is performed to pattern the memory stack layer 300 to form a plurality of memory stack structures 330 on the memory device region 16 and remove the memory stack layer 300 on the logic device region 14. For the sake of simplification, only two memory stack structures 330 are shown in the memory device region 16. According to an embodiment, the patterning process may include the following steps. First, a patterned hard mask layer (not shown), such as a patterned silicon oxide layer or a patterned silicon nitride layer, is formed on the top electrode layer 316. A first stage of etching, such as a reactive ion etching (RIE) process, using the patterned hard mask layer as an etching mask is performed to etch the top electrode layer 316, thereby transferring the pattern of the patterned hard mask layer to the top electrode layer 316. Afterward, a second stage of etching, such as an ion beam etching (IBE) process, using the patterned top electrode layer 316 as an etching mask is performed to etch the capping layer 314, the MTJ stack layer 304 and the bottom electrode layer 302, thereby transferring the pattern of the patterned top electrode layer 316 to the capping layer 314, the MTJ stack layer 304 and the bottom electrode layer 302 and the memory stack structures 330 as shown in FIG. 2 are obtained. According to an embodiment, the first dielectric material layer 204 exposed from the memory stack structures 330 on the memory device region 16 and the first dielectric material layer 204 on the logic device region 14 may be over-etched by the second stage of etching (the IBE process) to ensure unnecessary memory stack layer 300 being removed. Accordingly, the first dielectric material layer 204 may have a recessed top surface 204a.

Please still refer to FIG. 2. Subsequently, an insulating layer 402 is formed on the substrate 10 and conformally covers top surfaces 330a and sidewalls 330b of the memory stack structures 330 and the recessed top surface 204a of the first dielectric layer 204. The insulating layer 402 may comprise insulating material such as silicon nitride (SiN), silicon carbon nitride (SiCN) or silicon oxynitride (SiON) and may be formed by chemical vapor deposition (CVD) process, but not limited thereto. According to an embodiment, the insulating layer 402 is formed in-situ after the second stage of etching, i.e. the IBE process to prevent the exposed sidewalls 330b of the memory stack structures 330 from being oxidized or absorbing contamination. As shown in FIG. 2, the portion of the insulating layer 402 covering the recessed top surface 204a of the first dielectric layer 204 has a first thickness T1. The portion of the insulating layer 402 covering the top surfaces 330a of the memory stack structures 330 has a second thickness T2. The portion of the insulating layer 402 covering the sidewalls 330b of the memory stack structures 330 has a third thickness T3. According to an embodiment, the first thickness T1 and the second thickness T2 are approximately the same. The third thickness T3 is smaller than the first thickness T1 and the second thickness T2. The third thickness T3 may be about 60% to 80% of the first thickness T1 or the second thickness T2. According to an embodiment, the first thickness T1, the second thickness T2 and the third thickness T3 may range from 300 Å to 500 Å, but not limited thereto.

Figure 3:
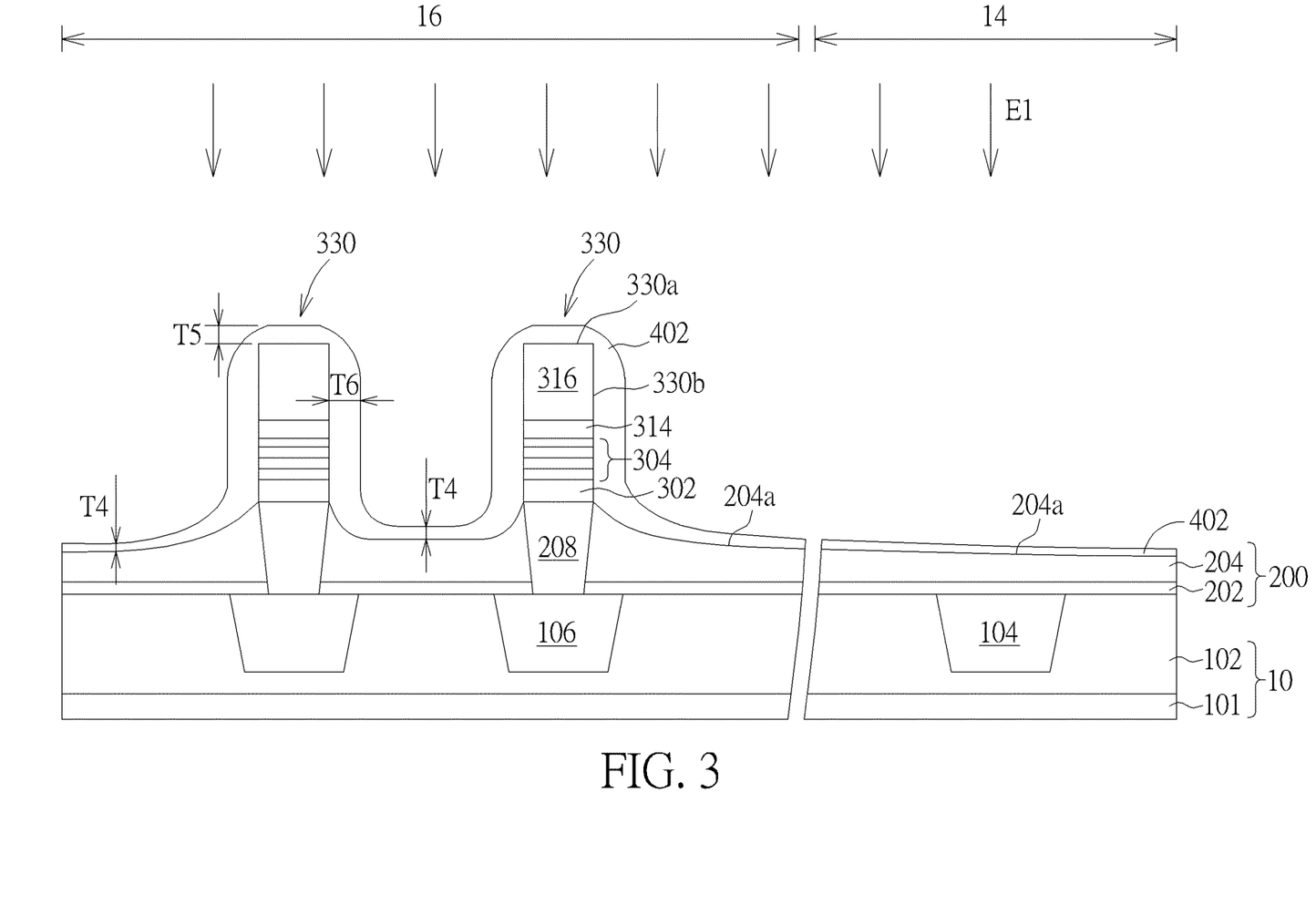

Please refer to FIG. 3. Subsequently, an anisotropic etching back process E1, such as a reactive ion etching (RIE) process, is performed to remove a portion of the insulating layer 402. None of the memory stack structures 330 and the first dielectric material layer 204 is exposed from the insulating layer 402 after the etching back process E1. The removal amount of the insulating layer 402 on the recessed top surface 204a of the first dielectric layer 204 and on the top surfaces 330a of the memory stack structures 330 is larger than the removal amount of the insulating layer 402 on the sidewalls 330b of the memory stack structures 330 during the etching back process E1. As shown in FIG. 3, after the etching back process E1, the portion of the insulating layer 402 covering the recessed top surface 204a of the first dielectric layer 204 has a fourth thickness T4. The portion of the insulating layer 402 covering the top surfaces 330a of the memory stack structures 330 has a fifth thickness T5. The portion of the insulating layer 402 covering the sidewalls 330b of the memory stack structures 330 has a sixth thickness T6. Preferably, the fourth thickness T4 and the fifth thickness T5 are approximately the same, and the sixth thickness T6 is larger than the fourth thickness T4 and the fifth thickness T5. According to an embodiment, the fourth thickness T4 and the fifth thickness T5 may range from 50 Å to 200 Å, and the sixth thickness T6 approximately equals to or is smaller than the third thickness T3 and may range from 300 Å to 500 Å.

Figure 4:
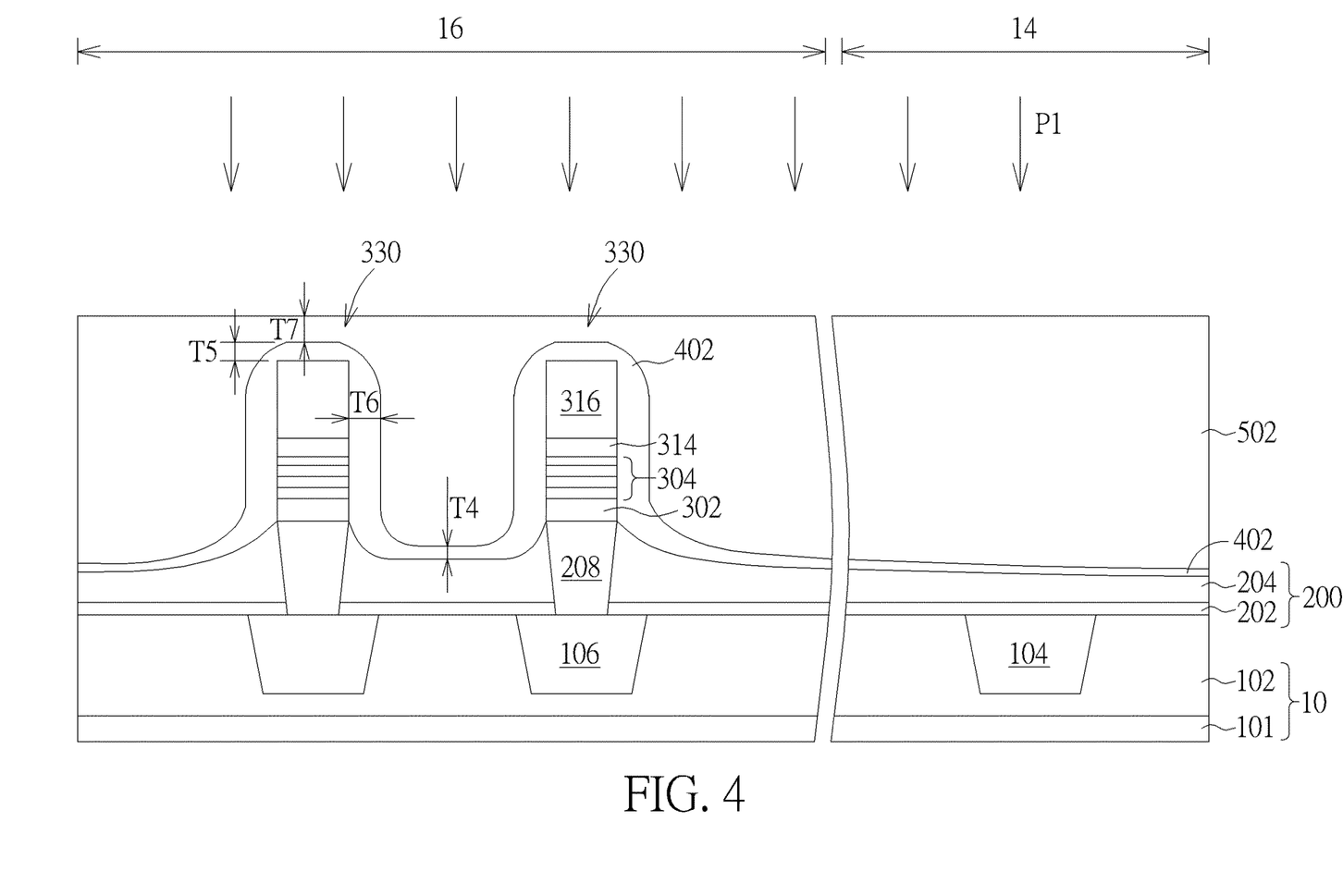

Please refer to FIG. 4. A second dielectric layer 502, such as a low-k dielectric layer, is then formed on the insulating layer 402, completely covers the logic device region 14 and the memory device region 16 and fills the spaces between the memory stack structures 330. The memory stack structures 330 are completely covered by the insulating layer 402 and are not in direct contact with the second dielectric layer 502. Subsequently, the second dielectric layer 502 is subjected to a planarization process, such as a first chemical mechanical process P1 until a planar top surface of the second dielectric layer 502 is obtained which does not expose any portion of the insulating layer 402. According to an embodiment, the first chemical mechanical process P1 uses polishing slurries in preference for removing the second dielectric layer 502 and may have a removal rate for the second dielectric layer 502 approximately between 45 to 65 angstroms per second (A/s). As shown in FIG. 4, after the first chemical mechanical process P1, the second dielectric layer 502 directly over the top surfaces 330a of the memory stack structures 330 has a seventh thickness T7. According to an embodiment, the seventh thickness T7 may range from 200 Å to 400 Å. The insulating layer 402 on the top surfaces 330a of the memory stack structures 330 is not exposed to the first chemical mechanical process P1 and therefore still has the fifth thickness T5.

Figure 5:
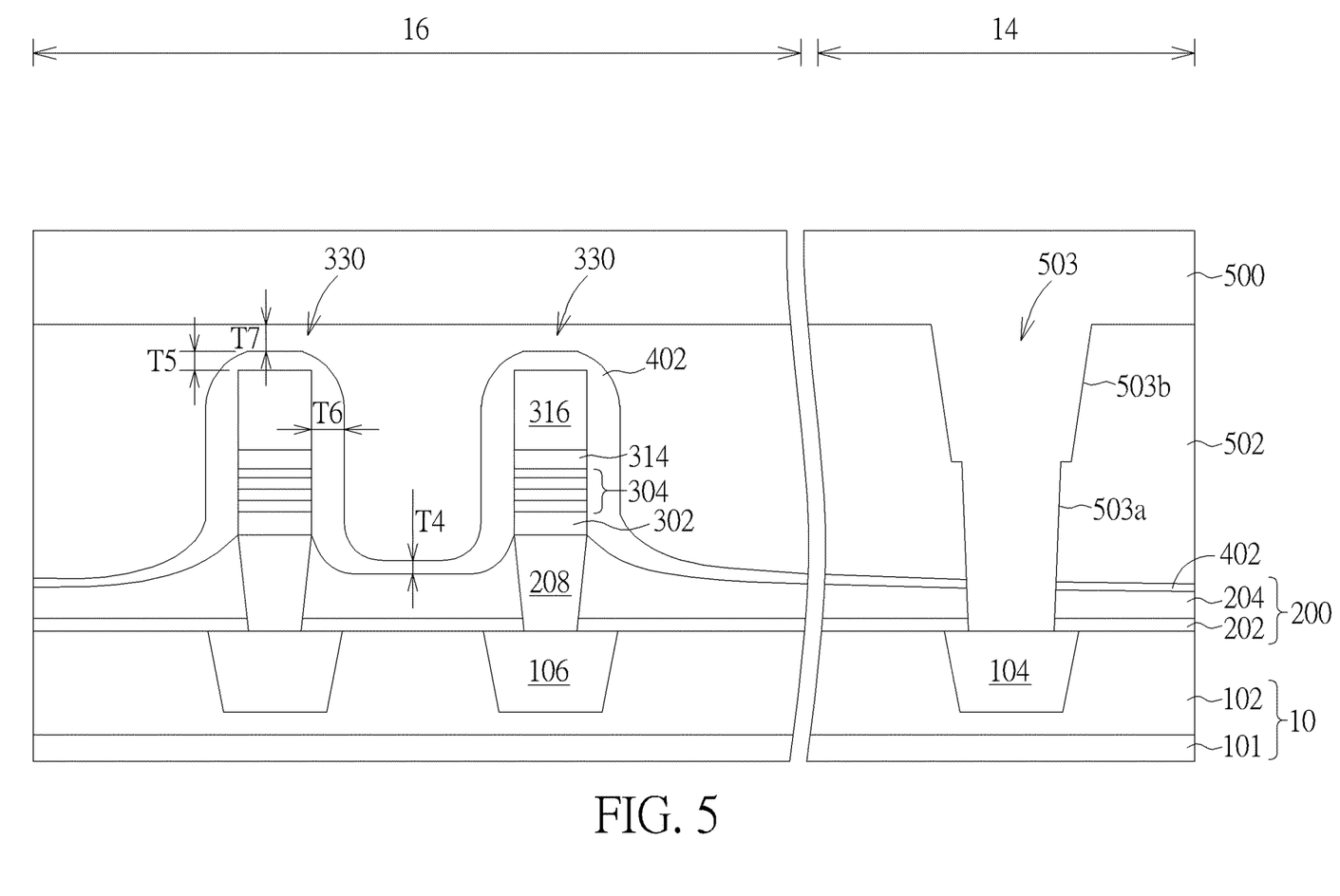

Please refer to FIG. 5. After planarizing the second dielectric layer 502, a patterning process is performed to define an opening 503 in the second dielectric layer 502 on the logic device region 14. A conductive material 500 is then formed on the second dielectric layer 502 to fill up the opening 503. According to an embodiment, the opening 503 may include a via hole 503a in the lower portion and a trench 503b in the upper portion of the opening 503, wherein the via hole 503a and the trench 503b are connected to each other and penetrate the second dielectric layer 502, the insulating layer 402, the first dielectric material layer 204 and the etching stop layer 202 to expose the interconnecting structure 104 in the logic device region 14 of the substrate 10. The conductive material 500 may comprise metal such as tungsten (W), copper (Cu), aluminum (Al), or other suitable metals, but not limited thereto. According to an embodiment, the conductive material 500 comprises copper.

Figure 6:
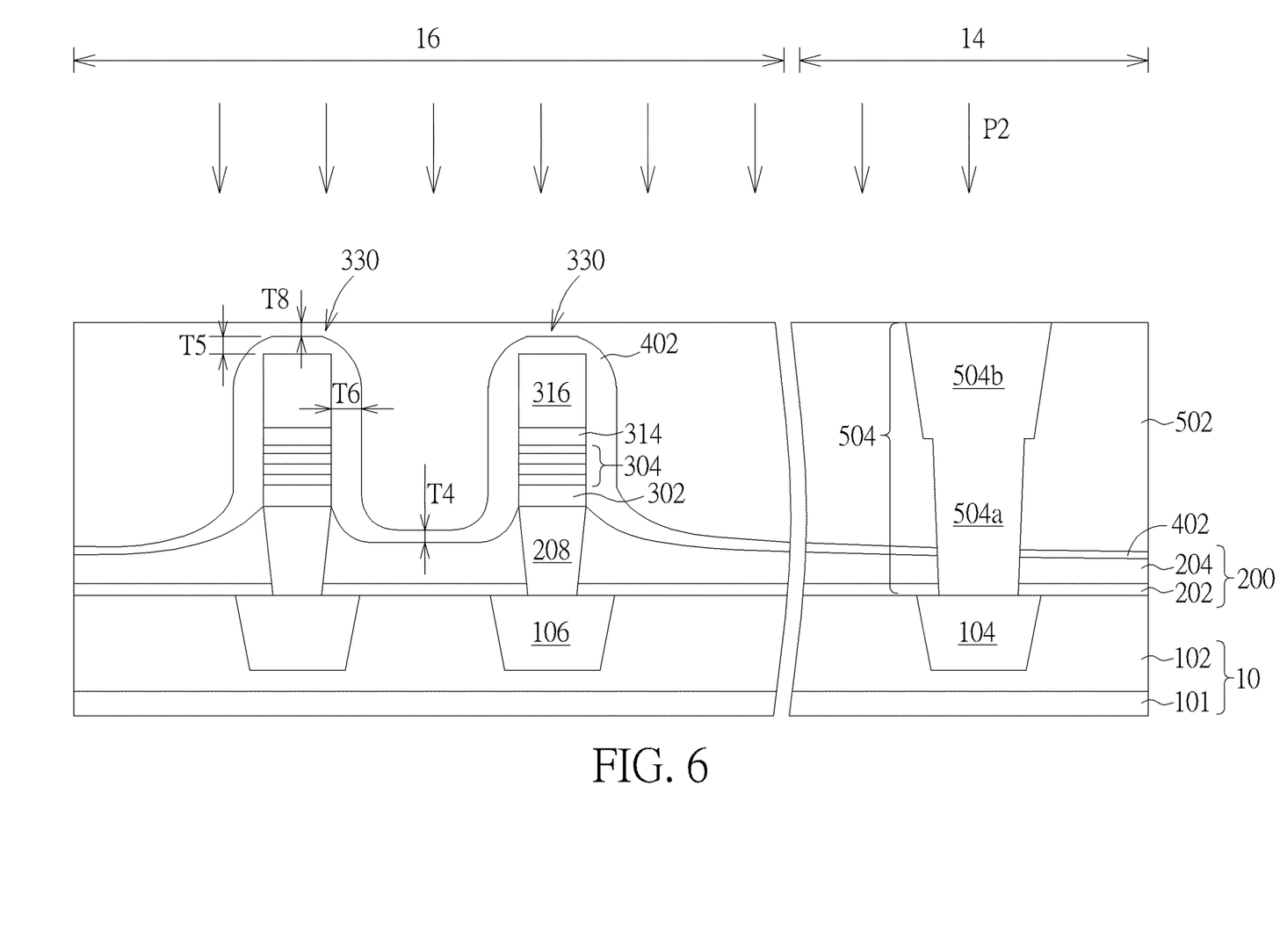

Please refer to FIG. 6. Following, a second chemical mechanical process P2 is performed to remove the conductive material 500 outside the opening 503 thereby forming an interconnecting structure 504 in the opening 503. The interconnecting structure 504 comprises a via portion 504a in the via hole 503a and a wiring portion 504b in the trench 503b. The bottom of the via portion 504a is in direct contact and electrically coupled to the interconnecting structure 104 in the substrate 10. The top surface of the wiring portion 504b is exposed from the second dielectric layer 502 for being electrically coupled to the interconnecting structure 604 (shown in FIG. 7) formed in later processes. In the embodiment, the second chemical mechanical process P2 may remove a portion of the second dielectric layer 502 but not expose the insulating layer 402 to ensure unnecessary conductive material 500 outside the opening 503 being completely removed. As shown in FIG. 6, after the second chemical mechanical process P2, the second dielectric layer 502 directly over the top surfaces 330a of the memory stack structures 330 has an eighth thickness T8. The eighth thickness T8 is smaller than the seventh thickness T7 and may range between 100 Å to 200 Å.

Figure 7:
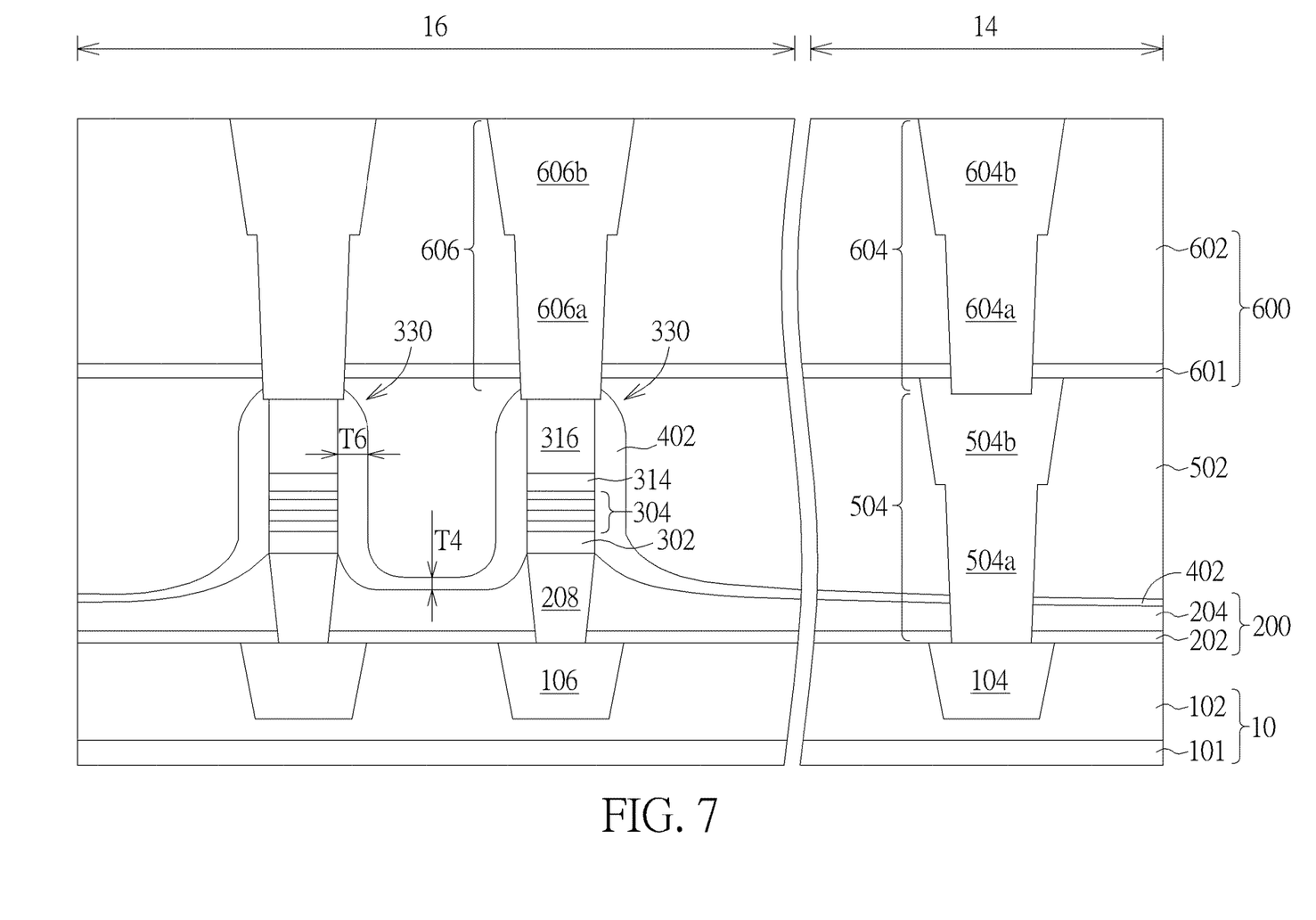

Please refer to FIG. 7. Following, a third dielectric layer 600 is formed on the second dielectric layer 502 and completely covering the logic device region 14 and the memory device region 16. The interconnecting structure 604 and interconnecting structures 606 are then formed respectively in the third dielectric layer 600 on the logic device region 14 and the memory device region 16. According to an embodiment, the third dielectric layer 600 may comprise multiple layers, such as an etching stop layer 601 and a third dielectric material layer 602 on the etching stop layer 601. The etching stop layer 601 may include dielectric materials such as silicon nitride (SiN), silicon carbon nitride (SiCN) or silicon oxynitride (SiON), or a combination thereof, but not limited thereto. The third dielectric material layer 602 may include dielectric materials such as silicon oxide ($SiO_2$) or low-k dielectric materials. According to an embodiment, the etching stop layer 601 and the etching stop layer 202 may comprise the same material, such as silicon carbon nitride (SiCN); the third dielectric material layer 602, the second dielectric layer 502 and the interlayer dielectric layer 102 may comprise the same material, such as low-k dielectric material; the first dielectric material layer 204 may comprise silicon oxide ($SiO_2$).

The interconnecting structures 604 and 606 may be made by similar processes for forming the interconnecting structure 504 as previously illustrated and would not be repeated. According to an embodiment, the interconnecting structure 604 in the logic device region 14 may comprise a lower via portion 604a and an upper wiring portion 604b connecting the via portion 604a, wherein the bottom of the via portion 604a directly contacts and is electrically coupled to the wiring portion 504b of the interconnecting structure 504, and the top surface of the wiring portion 604b is exposed from the third dielectric material layer 602 for further electrical interconnection. The interconnecting structures 606 in the memory device region 16 may respectively comprise a lower via portion 606a and an upper wiring portion 606b on the via portion 606a and connecting to the via portion 606a, wherein the via portion 606a (also referred as top via) is aligned to one of the memory stack structures 330 and penetrates through the second dielectric layer 502 and the insulating layer 402 on the top surface 330a of the memory stack structure 330 to electrically connect to the top electrode 316. The wiring portion 606b is exposed from the third dielectric material layer 602 for further electrical connection.

As previously illustrated, the first chemical mechanical process P1 does not expose and remove any portion of the insulating layer 402 and the portion of the insulating layer 402 on the top surfaces 330a of the memory stack structures 330 still has the fifth thickness T5 which may be better-controlled to have desired thickness and uniformity by the deposition process of the insulating layer 402 and the following etching back process E1. The degradation of thickness uniformity of the insulating layer 402 caused by loading effect of the first chemical mechanical process P1 may be avoided. In this way, it may be better guaranteed that the etching process for defining the via holes (not shown) of the via portions 606a of the interconnecting structures 606 may etch through the insulating layer 402 on the top surfaces 330a of the memory stack structures 330. Problems of etching stop or damages due to thickness variation of the insulating layer 402 may be reduced.

Figure 10:
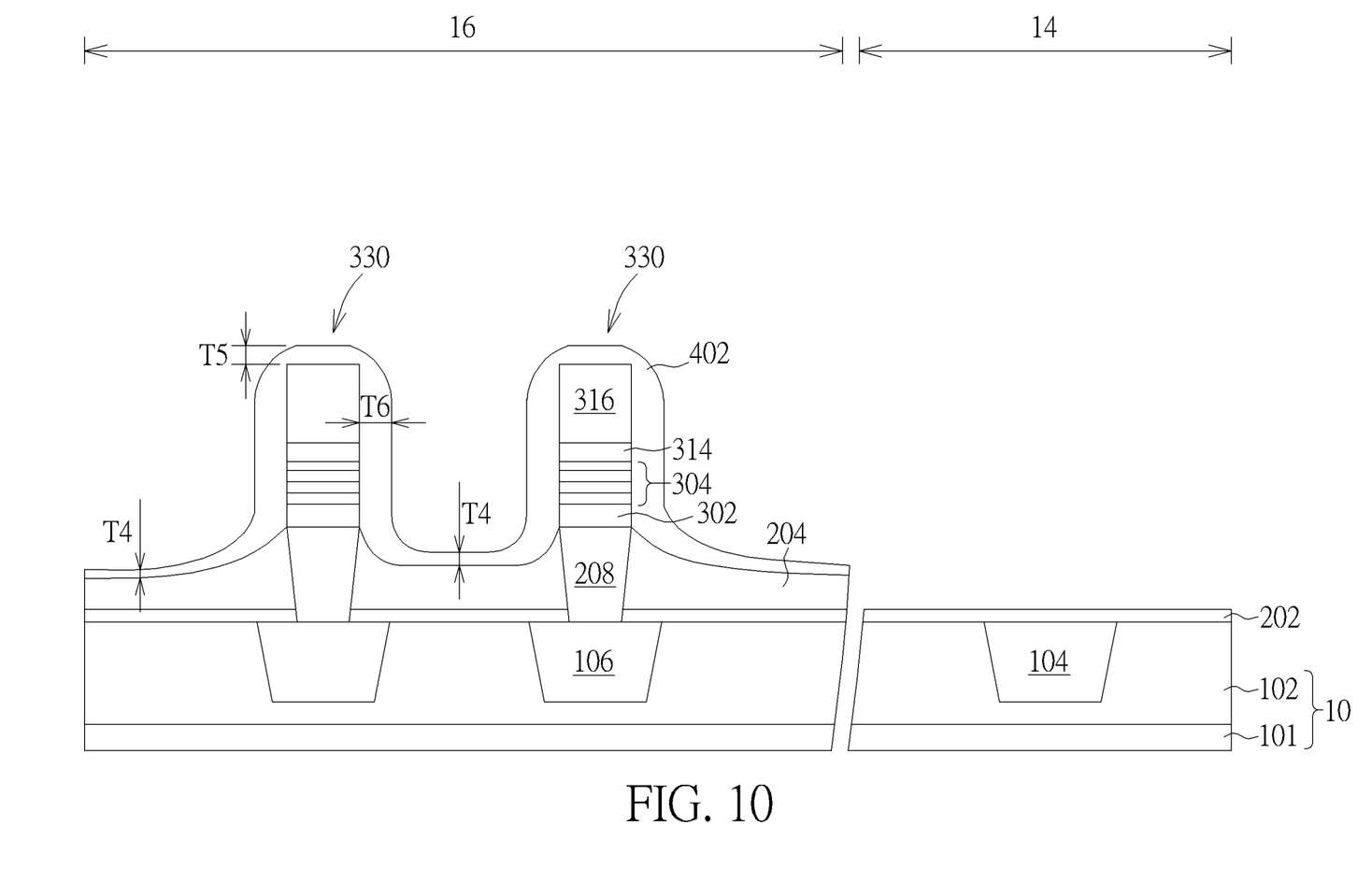
FIG. 10 and FIG. 11 are schematic diagrams illustrating a modification of the first embodiment.
Figure 11:
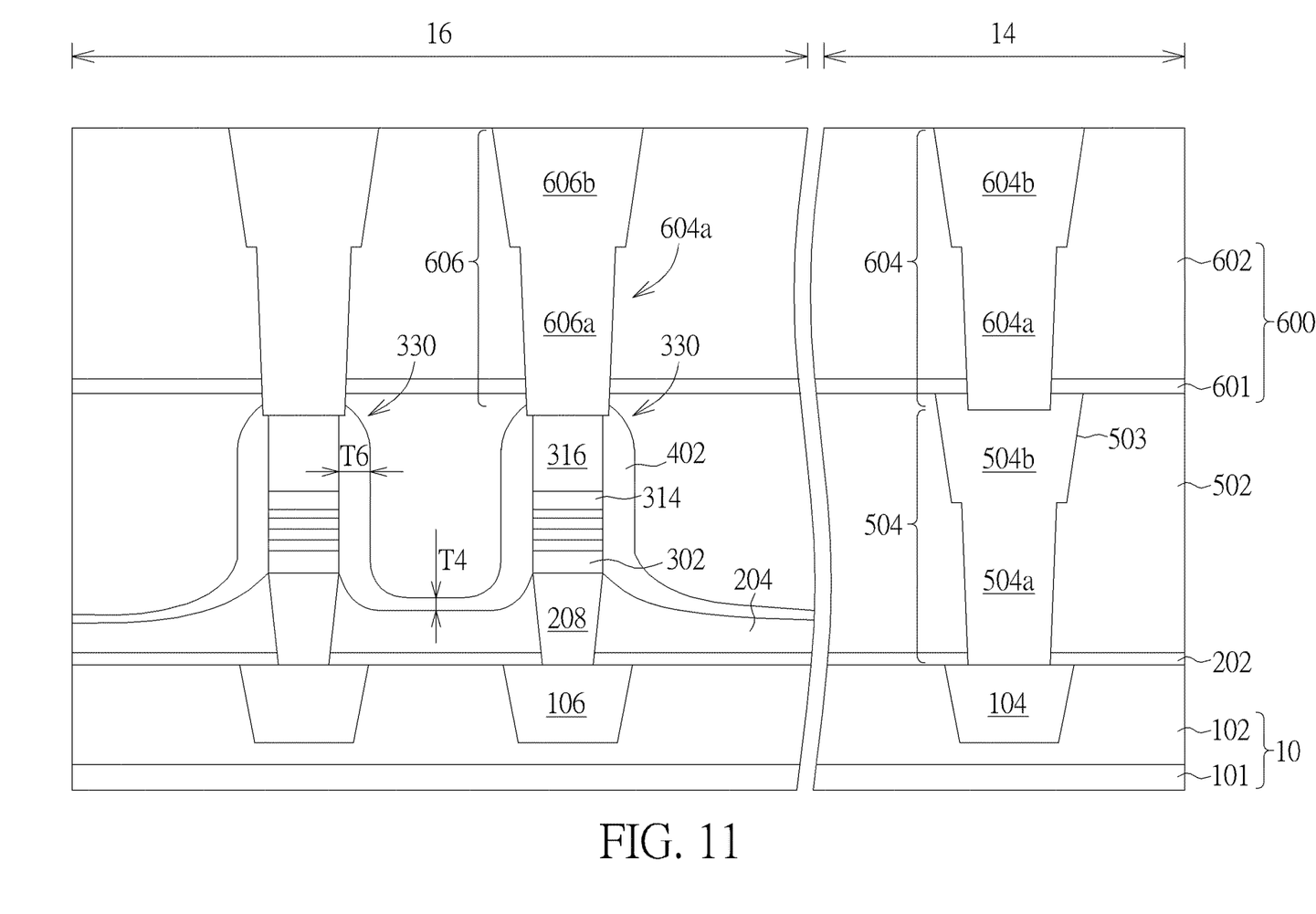

Please refer to FIG. 10 and FIG. 11, which are schematic diagrams illustrating a modification of the first embodiment as shown in FIG. 1 to FIG. 7. As shown in FIG. 10, after the etching back process E1 illustrated in FIG. 3, a patterned photoresist layer (not shown) may be formed on the substrate 10 to cover the memory device region 16. Afterward, using the patterned photoresist layer as an etching mask, the insulating layer 402 and the first dielectric material layer 204 on the logic device region 14 are removed and the etching stop layer 202 on the logic device region 14 is exposed. Following, process steps as illustrated in FIG. 4 to FIG. 6 are performed, including forming the second dielectric layer 502, performing the first chemical mechanical process P1, forming the interconnecting structure 504, forming the third dielectric layer 600 and forming the interconnecting structures 60 and 606, thereby obtaining the structure as shown in FIG. 11. In the modification, the second dielectric layer 502 is in direct contact with the etching stop layer 202 on the logic device region 14. By selectively removing the insulating layer 402 and the first dielectric material layer 204 that may have materials different from the material of the second dielectric layer 502, the etching process for defining the opening 503 of the interconnecting structure 504 may be facilitated. As shown in FIG. 11, in the modification, the via portions 606a of the interconnecting structures 606 penetrates through the second dielectric layer 502 and the insulating layer 402 on the top surface 330a of one of the memory stack structure 330 to electrically connect to the top electrode 316 of memory stack structure 330.

Figure 8:
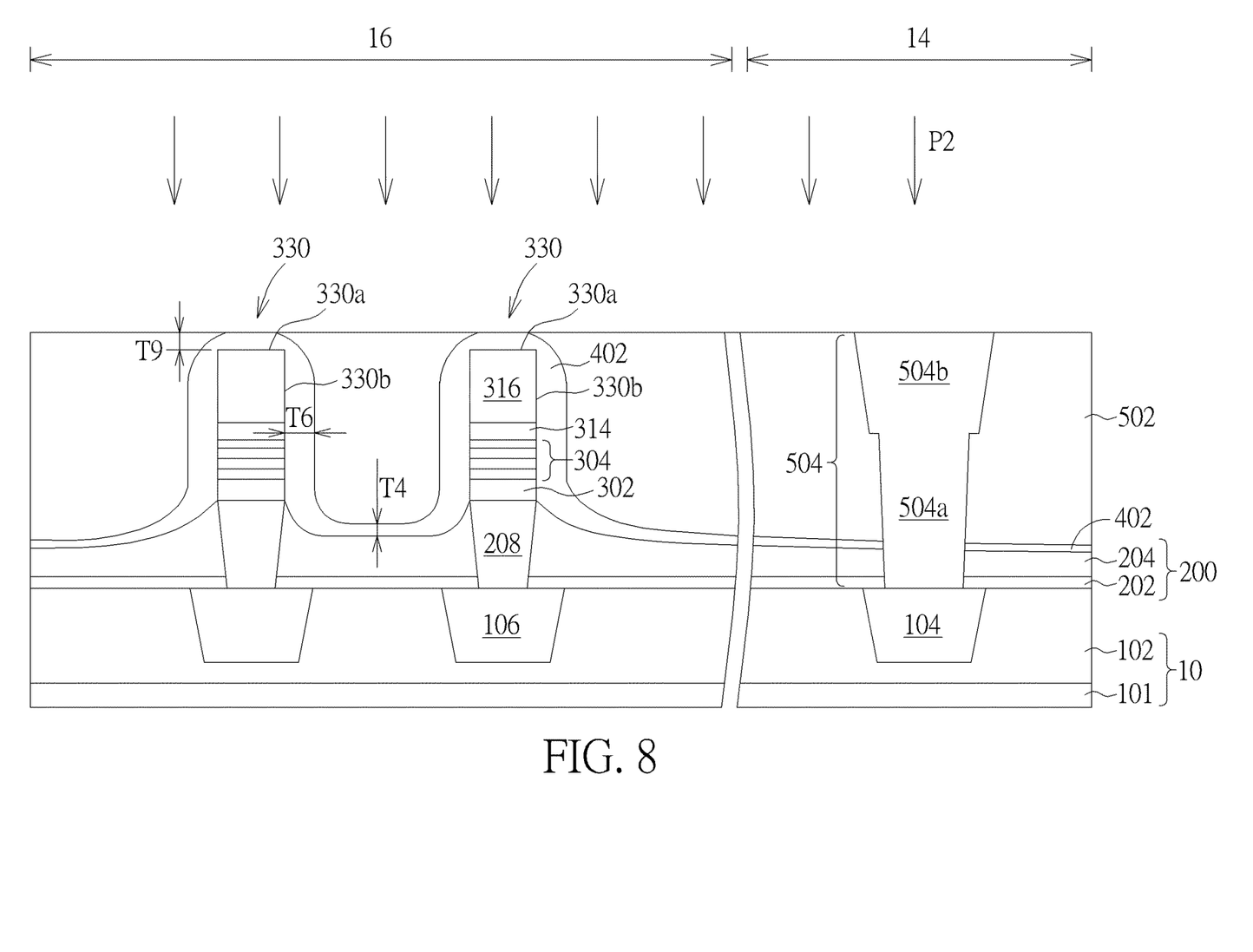
FIG. 8 and FIG. 9 are schematic diagrams illustrating the steps of forming a semiconductor structure according to a second embodiment of the present invention, wherein FIG. 8 corresponds to the steps shown in FIG. 6, and FIG. 9 corresponds to the steps shown in FIG. 7 as shown in the first embodiment of the present invention.
Figure 9:
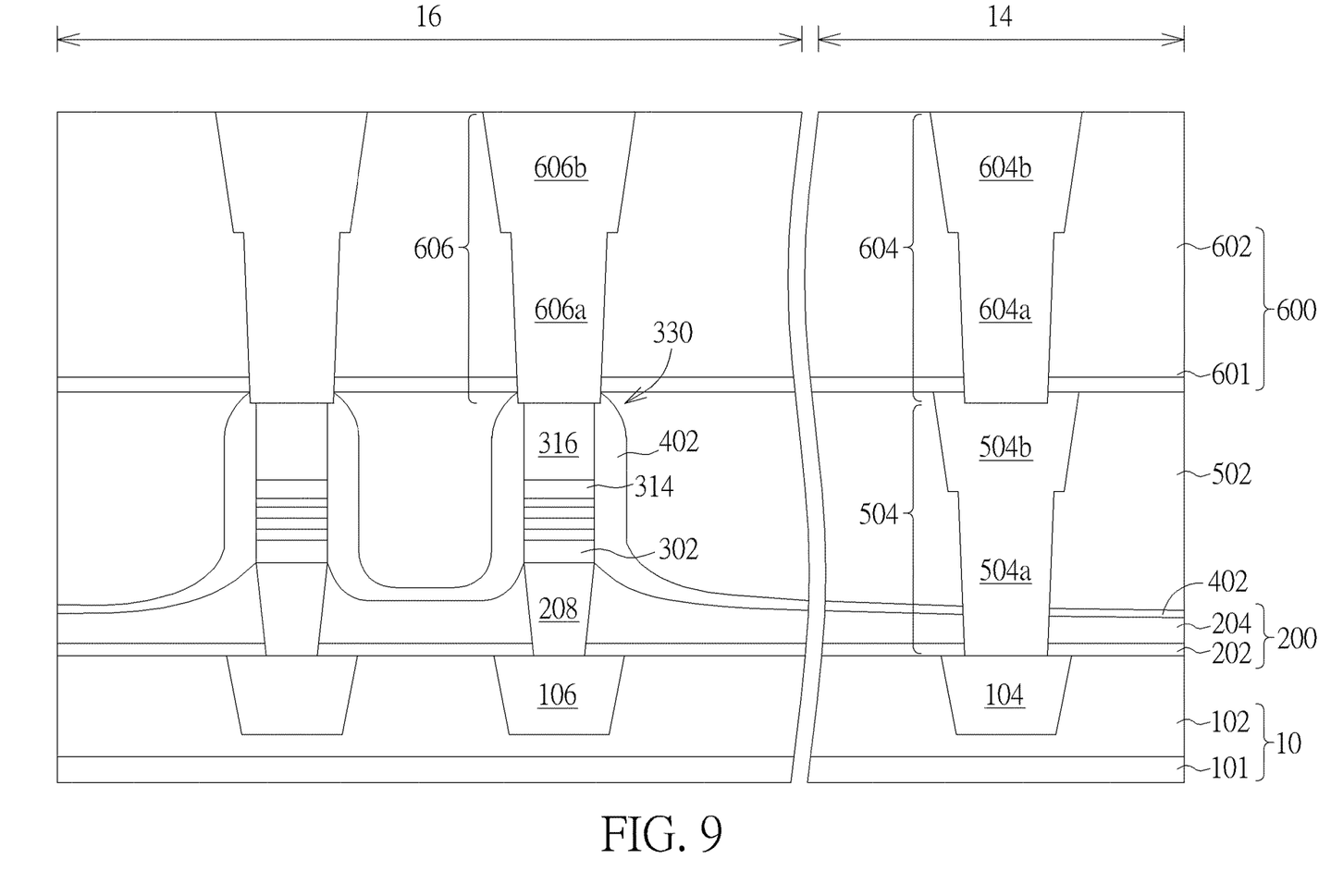

Please refer to FIG. 1 to FIG. 5 and FIG. 8 to FIG. 9, which are schematic diagrams illustrating the steps of forming a semiconductor structure according to a second embodiment of the present invention. The step shown in FIG. 8 corresponds to the step shown in FIG. 6. The step shown in FIG. 9 corresponds to the step shown in FIG. 7. Details of the steps shown in FIG. 1 to FIG. 5 have been illustrated previously and would not be repeated herein. The major difference between the first embodiment and the second embodiment is that, as shown in FIG. 8, after the second chemical mechanical process P2, the insulating layer 402 on the top surfaces 330a of the memory stack structures 330 is exposed and has a ninth thickness T9. Because the second chemical mechanical process P2 uses polishing slurries in preference for removing metals, i.e. the conductive material 500 rather than removing dielectric materials, it may have slower removal rate and smaller loading effect for the insulating layer 402 with respect to the removal rate for the insulating layer 402 by the first chemical mechanical process P1. For example, the first chemical mechanical process P1 may have a removal rate between 45 Å/s and 65 Å/s for the insulating layer 402. The second chemical mechanical process P2 may have a removal rate between 10 Å/s and 20 Å/s for the insulating layer 402. Accordingly, in the second embodiment, although the insulating layer 402 on the top surfaces 330a of the memory stack structures 330 is exposed to the second chemical mechanical process P2, the uniformity of the insulating layer 402 may be maintained without being degraded by the second chemical mechanical process P2. According to an embodiment, the ninth thickness T9 approximately equals to or is smaller than the fifth thickness T5. For example, the ninth thickness T9 may range from 50 Å to 200 Å. After the second chemical mechanical process P2, as shown in FIG. 9, a third dielectric layer 600 is formed on the second dielectric layer 502 and the interconnecting structures 604 and 606 are formed in the third dielectric layer 600 on the logic device region 14 and the memory device region 16, respectively. In the second embodiment, the etching stop layer 601 is in direct contact with the insulating layer 402 on the top surfaces 330a of the memory stack structures 330. The via portions 606a of the interconnecting structures 606 are respectively aligned to one of the memory stack structures 330 and penetrate through the insulating layer 402 on the top surfaces 330a of the memory stack structures 330 to electrically connect to the top electrodes 316 of memory stack structures 330.

Figure 12:
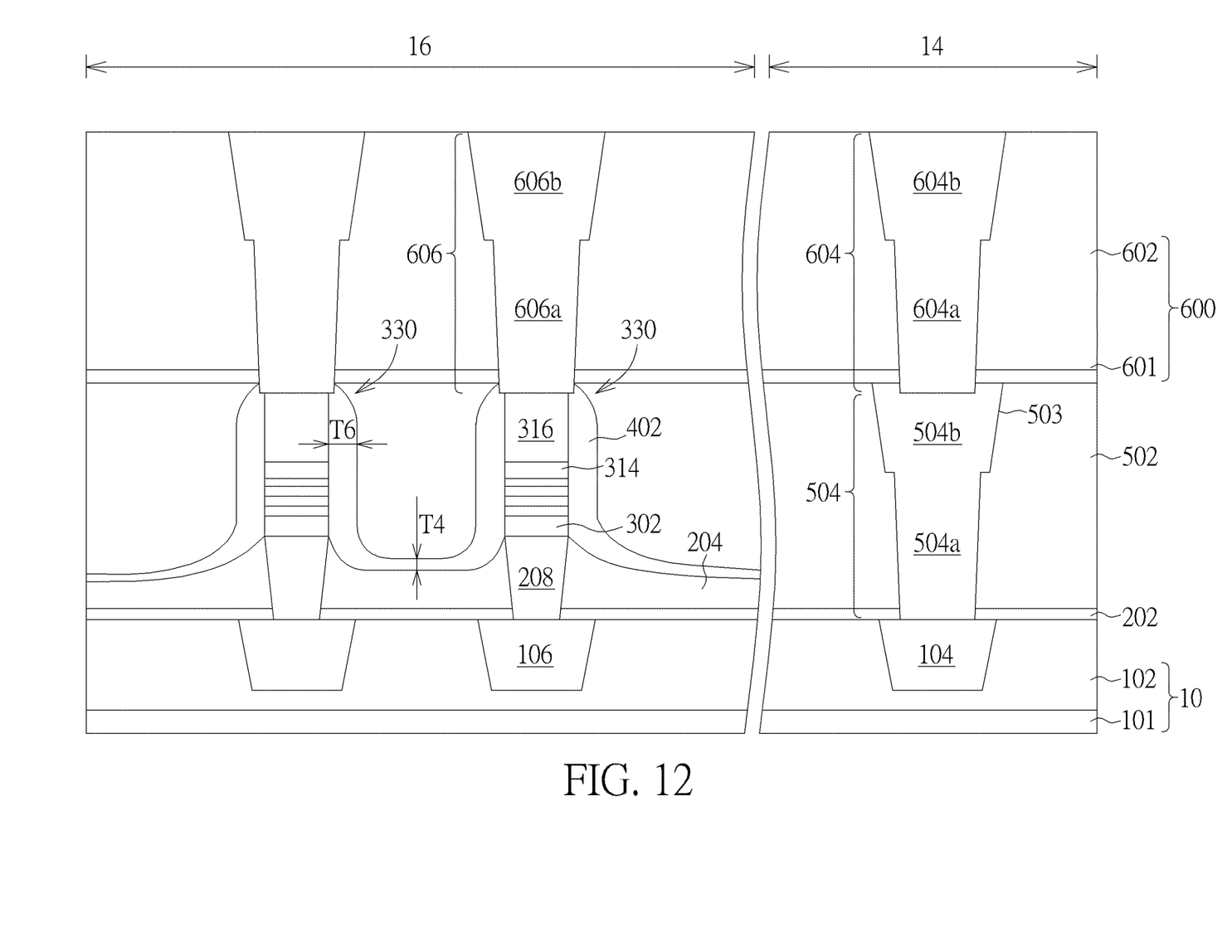
FIG. 12 is a schematic diagram illustrating a modification of the second embodiment.

Please refer to FIG. 12, which is a schematic diagram illustrating a modification of the second embodiment. As shown in FIG. 12, after the etching back process E1 as illustrated in FIG. 3, the insulating layer 402 and the first dielectric material layer 204 on the logic device region 14 are selectively removed and the etching stop layer 202 on the logic device region 14 is exposed. Process steps as illustrated in FIG. 4, FIG. 5 and FIG. 8 are then performed, including forming the second dielectric layer 502, performing the first chemical mechanical process P1, forming the interconnecting structure 504, forming the third dielectric layer 600 and forming the interconnecting structures 60 and 606, thereby obtaining the structure as shown in FIG. 12. The etching stop layer 601 is in direct contact with the insulating layer 402 on the top surfaces 330a of the memory stack structures 330. The via portions 606a of each interconnecting structures 606 are respectively aligned to one of the memory stack structures 330 and penetrate through the insulating layer 402 on the top surfaces 330a of the memory stack structures 330 to electrically connect to the top electrodes 316 of memory stack structures 330.

One feature of the method provided by the present invention is that the first chemical mechanical process P1 stops on the second dielectric layer 502 without exposing any portion of the insulating layer 402. The insulating layer 402 on the top surfaces 330a of the memory stack structures 330 remains the fifth thickness T5 which may be better-controlled to have desired thickness and uniformity by the deposition process of the insulating layer 402 and the following etching back process E1. In this way, it may be better guaranteed that the etching process for forming the via portions 606a of the interconnecting structures 606 may etch through the insulating layer 402 on the top surfaces 330a of the memory stack structures 330. Etching stop or damages due to thickness variation of the insulating layer 402 may be reduced and the quality of the electrical connections between the via portions 606a and the top electrodes 316 of the memory stack structures 330 may be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
    a substrate having a memory device region and a logic device region;
    a first dielectric layer on the substrate;
    a plurality of memory stack structures on the first dielectric layer on the memory device region;
    an insulating layer conformally covering the memory stack structures and the first dielectric layer;
    a second dielectric layer on the insulating layer and completely filling the spaces between the memory stack structures; and
    a first interconnecting structure formed in the second dielectric layer on the logic device region, wherein a top surface of the first interconnecting structure is flush with a top surface of the second dielectric layer and a top surface of the insulating layer, and the top surface of the first interconnecting structure is higher than top surfaces of the memory stack structures.

2. The semiconductor structure according to claim 1, wherein the insulating layer directly contacts the memory stack structures and the first dielectric layer.

3. The semiconductor structure according to claim 1, wherein the memory stack structures and the first dielectric layer are not in direct contact with the second dielectric layer by being covered by the insulating layer.

4. The semiconductor structure according to claim 1, further comprising:
    a third dielectric layer on the second dielectric layer; and
    a plurality of second interconnecting structures through the third dielectric layer and the insulating layer on the top surfaces of the memory stack structures to contact the top surfaces of the memory stack structures.

5. The semiconductor structure according to claim 4, wherein the third dielectric layer is in direct contact with the insulating layer and the top surface of the first interconnecting structure.

6. The semiconductor structure according to claim 1, wherein the insulating layer on the logic device region directly contacts a sidewall of the first interconnecting structure.

7. The semiconductor structure according to claim 1, wherein the first dielectric layer comprises an etching stop layer and a first dielectric material layer on the etching stop layer, wherein the insulating layer and the first dielectric material layer of the first dielectric layer on the logic device region are removed and the second dielectric layer is in direct contact with the etching stop layer of the first dielectric layer on the logic device region of the substrate.

8. The semiconductor structure according to claim 4, wherein the first dielectric layer comprises a silicon carbon nitride (SiCN) layer and a silicon oxide ($SiO_2$) layer, the second dielectric layer comprises a low-k dielectric layer, and the third dielectric layer comprises a silicon carbon nitride (SiCN) layer and a silicon oxide ($SiO_2$) layer.

9. The semiconductor structure according to claim 1, wherein the memory stack structures respectively comprise:
    a bottom electrode layer;
    a MTJ stack layer on the bottom electrode layer; and
    a top electrode layer on the MTJ stack layer.

10. The semiconductor structure according to claim 1, further comprising a plurality of bottom vias in the first dielectric layer on the memory device region, wherein each of the memory stack structures are directly disposed on one of the bottom vias.

11. The semiconductor structure according to claim 10, wherein bottom surfaces of the bottom vias are flush with a bottom surface of the first interconnecting structure.

* * * * *